US008710838B2

(12) United States Patent
Miyazaki et al.

(10) Patent No.: US 8,710,838 B2
(45) Date of Patent: Apr. 29, 2014

(54) MAGNETIC RESONANCE IMAGING APPARATUS

(75) Inventors: Mitsue Miyazaki, Mount Prospect, IL (US); Satoshi Sugiura, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 500 days.

(21) Appl. No.: 12/971,517

(22) Filed: Dec. 17, 2010

(65) Prior Publication Data

US 2011/0148413 A1 Jun. 23, 2011

(30) Foreign Application Priority Data

Dec. 18, 2009 (JP) .................. 2009-288184
Dec. 16, 2010 (JP) .................. 2010-280116

(51) Int. Cl.
*G01V 3/00* (2006.01)
(52) U.S. Cl.
USPC ....................................... 324/309
(58) Field of Classification Search
USPC ................. 324/307–322
See application file for complete search history.

(56) References Cited

U.S. PATENT DOCUMENTS

| 4,718,424 | A * | 1/1988 | Nishimura ............ 600/419 |
| 6,801,800 | B2 | 10/2004 | Miyazaki et al. |
| 2010/0134103 | A1 * | 6/2010 | Edelman et al. ........ 324/309 |

FOREIGN PATENT DOCUMENTS

JP 2003-339662 12/2003

OTHER PUBLICATIONS

Koktzoglou, et al, Ghost Magnetic Resonance Angiography, Magnetic Resonance in Medicine 61:1515-1519 (2009).*
Koktzoglou et al., "Unenhanced 3D Ghost MR Angiography by Toggled Systolic and Diastolic Imaging", *Proceedings, International Society for Magnetic Resonance in Medicine*, Apr. 17, 2009, p. 1874.
Koktzoglou et al., "On the Amenability of Ghost Imaging to Large Parallel Acceleration Factors", *Proceedings, International Society for Magnetic Resonance in Medicine*, Apr. 17, 2009, p. 1869.

* cited by examiner

*Primary Examiner* — Melissa Koval
*Assistant Examiner* — Daniel Miller
(74) *Attorney, Agent, or Firm* — Nixon & Vanderhye PC

(57) ABSTRACT

A magnetic resonance imaging apparatus includes the data gathering unit gathers magnetic resonance data in a non-contrast manner by applying a first readout gradient pulse having a zero-order moment of 0 and second readout gradient pulse having a zero-order moment of 0 and a first-order moment of a value different from a value of a first-order moment of the first readout gradient pulse to a region of interest including a fluid in motion, and periodically arranging first magnetic resonance data readout with the first readout gradient pulse and second magnetic resonance data read out with the second readout gradient pulse in at least one of a phase encoding direction and a slice encoding direction in a k-space to generate k-space data and reconstructs the k-space data to generate an image in which a fluid image and static part image surrounding the fluid are spatially separated from each other.

16 Claims, 15 Drawing Sheets

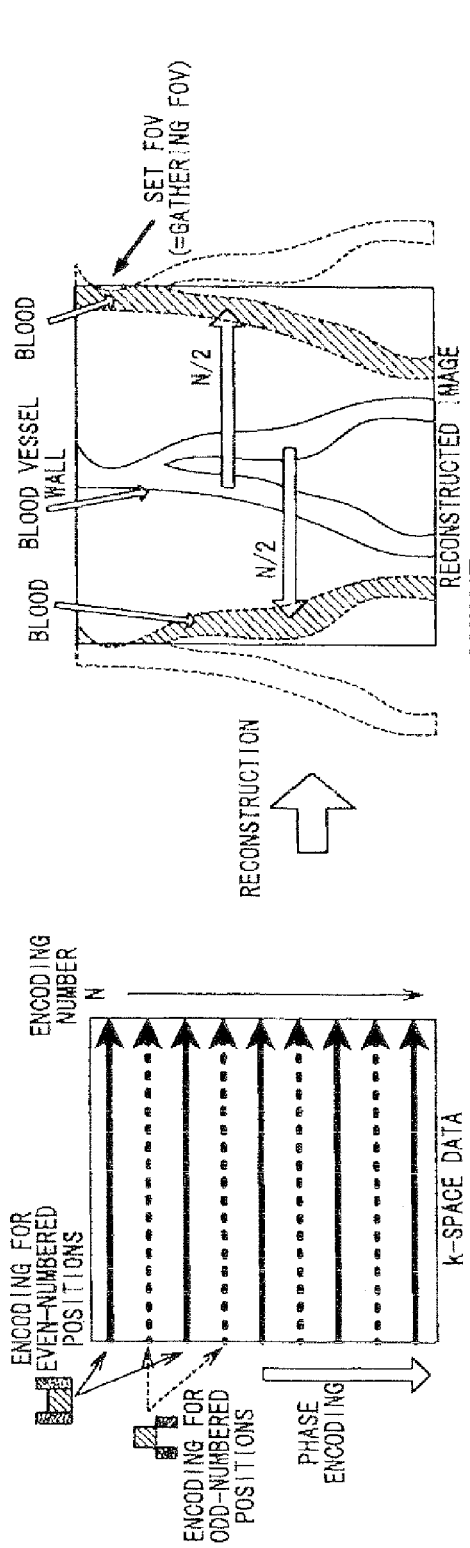
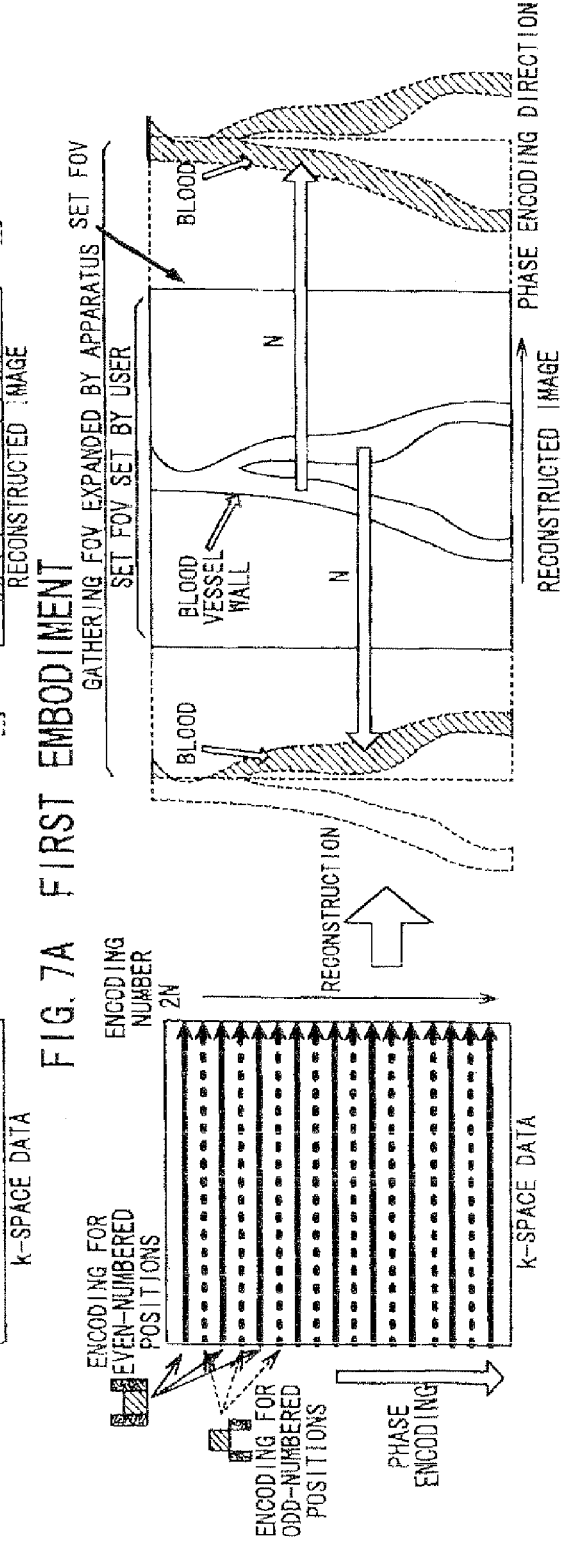
FIG. 7A FIRST EMBODIMENT
FIG. 7B SECOND EMBODIMENT

MAGNETIC RESONANCE IMAGING APPARATUS

CROSS-REFERENCE TO RELATED APPLICATIONS

This application is based upon and claims the benefit of priority from Japanese Patent Application No. 2009-288184 filed on Dec. 18, 2009, and No. 2010-280116 filed on Dec. 16, 2010, the entire contents of which are incorporated herein by reference.

FIELD

Embodiments described herein relate generally to a Magnetic Resonance Imaging apparatus.

BACKGROUND

Magnetic resonance imaging is an image reconstruction process that involves transmitting an RF signal at a Larmor frequency into an object in a static magnetic field to magnetically excite a nuclear spin in the object and reconstructing an image from an MR signal produced as a result of the nuclear spin.

Magnetic resonance angiography (MRA) to obtain a blood flow image is a known magnetic resonance imaging method. A type of MRA that does not use a contrast medium is referred to as non-contrast MRA. For the non-contrast MRA, a fresh blood imaging (FBI) method and a steady state free precession (SSFP) method have been devised. The FBI method uses electrocardiogram gating to visualize a blood vessel with high quality by capturing a blood flow at a high flow speed pumped by a heart. The FBI method and the SSFP method produce a bright blood image in which the blood has a high signal value and is shown in white.

In the FBI method, a flow dephasing pulse or a flow rephasing pulse may be added to a readout gradient pulse in order to visualize a blood flow at a low flow speed. In this case, the flow dephasing pulse or the flow rephasing pulse serves to increase the signal difference between a signal value from a blood flow at a high flow speed and a signal value from a blood flow at a low flow speed. Since the signal difference increases, an artery and a vein can be more clearly distinguished from each other.

Furthermore, as a technique of determining an appropriate intensity of the flow dephasing pulse or the flow rephasing pulse, there has been devised a technique of performing, in advance of the imaging scan, a pre-scan referred to as flow-prep scan to gather data while changing the intensity of the flow dephasing pulse or the flow rephasing pulse.

Furthermore, in order to reduce an N/2 artifact produced as a result of a periodic variation of the signal from a blood flow in a k-space, there has been devised a gradient moment nulling (GMN) technique to eliminate a gradient moment in a readout (RO) direction. According to the GMN technique, a rephasing pulse having an appropriate intensity can be applied, so that the N/2 artifact can be effectively reduced.

The techniques described above are intended for the bright blood imaging in which the blood (or the blood flow) has a high signal level. On the other hand, a black blood imaging method that produces a blood vessel wall image in which the blood has a low signal value and is shown in black and thus the blood vessel wall is emphasized is also often used for diagnosis.

According to prior art, the bright blood imaging to acquire a blood image and the black blood imaging to acquire a blood vessel wall image are separately performed, so that imaging has to be performed at least twice to obtain both the blood image and the blood vessel wall image.

Thus, there is a need for a magnetic resonance imaging apparatus that can easily obtain a blood image and a blood vessel wall image in a short time in a non-contrast manner.

BRIEF DESCRIPTION OF THE DRAWINGS

FIG. 7A is a diagram for illustrating shifting of the blood image according to the first embodiment;

FIG. 7B is a diagram for illustrating shifting of the blood image according to a second embodiment;

DETAILED DESCRIPTION

A magnetic resonance imaging apparatus according to an embodiment will be described with reference to the accompanying drawings. The magnetic resonance imaging apparatus according to this embodiment comprises a data gathering unit and an image generating unit, the data gathering unit gathers magnetic resonance data in a non-contrast manner by applying a first readout gradient pulse having a zero-order moment of 0 and a second readout gradient pulse having a zero-order moment of 0 and a first-order moment of a value different from a value of a first-order moment of the first readout gradient pulse to a region of interest including a fluid in motion, and the image generating unit periodically arranges first magnetic resonance data read out with the first readout gradient pulse and second magnetic resonance data read out with the second readout gradient pulse in at least one of a phase encoding direction and a slice encoding direction in a k-space to generate k-space data and reconstructs the k-space data to generate an image in which a fluid image and a static part image surrounding the fluid are spatially separated from each other.

(Configuration)

Figure 1:
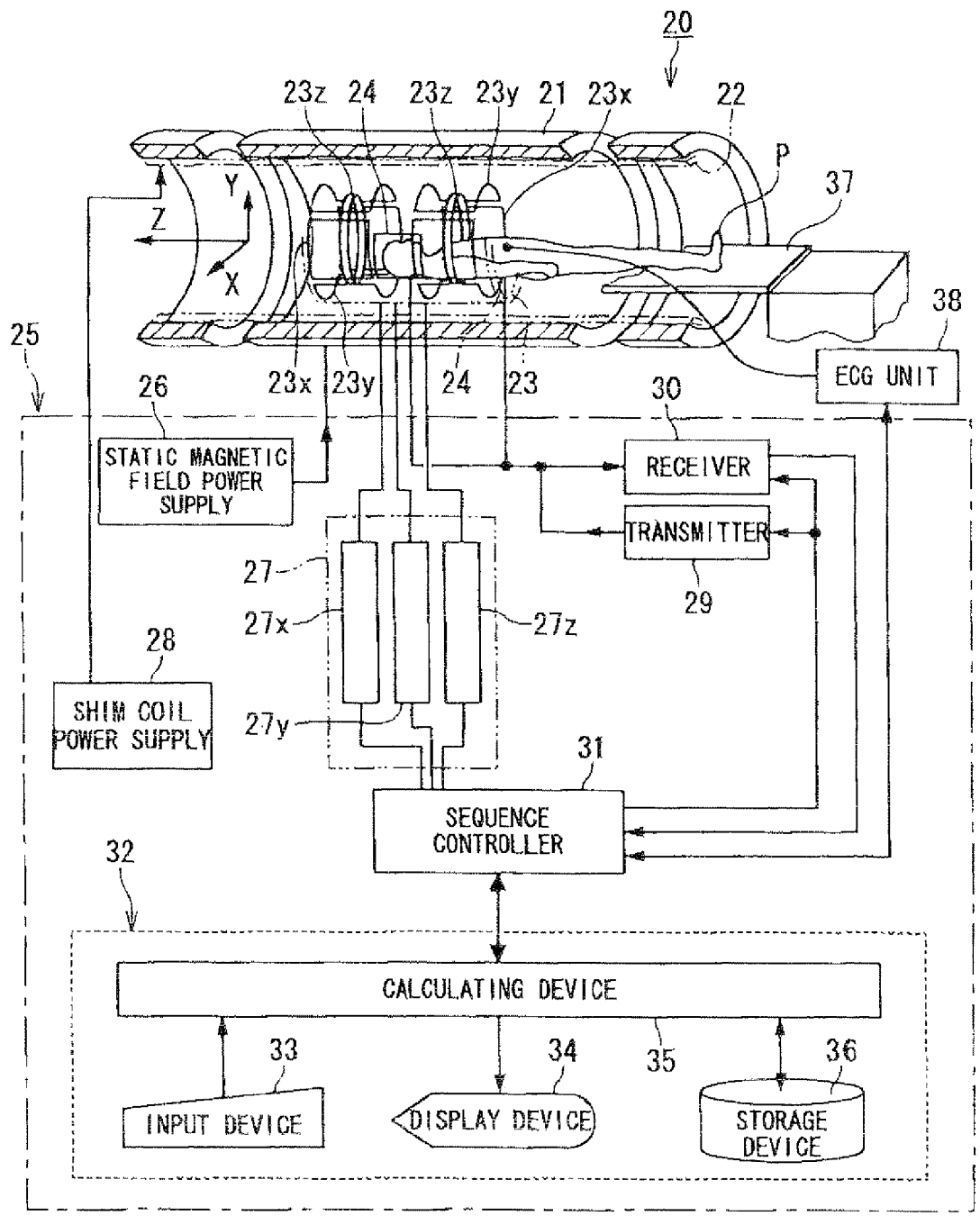
FIG. 1 is a diagram showing an exemplary configuration of a magnetic resonance imaging apparatus according to an embodiment.

FIG. 1 is a diagram showing a configuration of a magnetic resonance imaging apparatus according to an embodiment of the present invention.

A magnetic resonance imaging apparatus 20 has a cylindrical static magnetic field magnet 21 that produces a static magnetic field, and a shim coil 22, a gradient coil unit 23 and an RF coil unit 24 that are disposed inside the static magnetic field magnet 21.

The magnetic resonance imaging apparatus 20 further has a control system 25. The control system 25 has a static magnetic field power supply 26, a gradient power supply unit 27, a shim coil power supply 28, a transmitter 29, a receiver 30, a sequence controller 31, and a computer 32. The gradient power supply unit 27 of the control system 25 comprises an X-axis gradient power supply 27x, a Y-axis gradient power supply 27y, and a Z-axis gradient power supply 27z. The computer 32 has an input device 33, a display device 34, a calculating device 35 and a storage device 36.

The static magnetic field magnet 21 is connected to the static magnetic field power supply 26 and functions to produce a static magnetic field in an imaging region when a current is supplied from the static magnetic field power supply 26. The static magnetic field magnet 21 is typically formed by a superconductive coil and is connected to the static magnetic field power supply 26 and supplied with a current therefrom when the static magnetic field magnet 21 is excited. Once the static magnetic field magnet 21 is excited, the static magnetic field magnet 21 is typically disconnected from the static magnetic field power supply 26. Alternatively, the static magnetic field magnet 21 may be a permanent magnet, and the static magnetic field power supply 26 may be omitted.

The cylindrical shim coil 22 is coaxially disposed in the static magnetic field magnet 21. The shim coil 22 is connected to the shim coil power supply 28, and the shim coil power supply 28 supplies a current to the shim coil 22 to make the static magnetic field uniform.

The gradient coil unit 23 comprises an X-axis gradient coil 23x, a Y-axis gradient coil 23y and Z-axis gradient coil 23z that are cylindrically arranged in the static magnetic field magnet 21. A bed 37, which is an imaging region, is placed in the gradient coil unit 23 and an object P is placed on the bed 37. The RF coil unit 24 includes a whole body coil (WBC) for transmitting and receiving an RF signal incorporated in a gantry and a local coil for receiving an RF signal disposed in the vicinity of the bed 37 or the object P, for example.

The gradient coil unit 23 is connected to the gradient power supply unit 27. The X-axis gradient coil 23x, the Y-axis gradient coil 23y and the Z-axis gradient coil 23z of the gradient coil unit 23 are connected to the X-axis gradient power supply 27x, the Y-axis gradient power supply 27y and the Z-axis gradient power supply 27z of the gradient power supply unit 27, respectively.

When the X-axis gradient power supply 27x, the Y-axis gradient power supply 27y and the Z-axis gradient power supply 27z supply a current to the X-axis gradient coil 23x, the Y-axis gradient coil 23y and the Z-axis gradient coil 23z, respectively, the X-axis gradient coil 23x, the Y-axis gradient coil 23y and the Z-axis gradient coil 23z produce a gradient Cx in an X-axis direction, a gradient Gy in a Y-axis direction and a gradient in a Z-axis direction in the imaging region, respectively.

The RF coil unit 24 is connected to the transmitter 29 and/or the receiver 30. A transmitting RF coil 24 functions to receive an RP signal from the transmitter 29 and transmit the RF signal to the object P. A receiving RF coil 24 functions to receive an NMR signal produced as a result of excitation of a nuclear spin in the object P by the RF signal and pass the NMR signal to the receiver 30.

The sequence controller 31 in the control system 25 is connected to the gradient power supply unit 27, the transmitter 29 and the receiver 30. The sequence controller 31 functions to store sequence information that describes control information required to drive the gradient power supply unit 27, the transmitter 29 and the receiver 30, such as operation control information including the intensity, the duration and the timing of application of a pulse current to the gradient power supply unit 27, and to drive the gradient power supply unit 27, the transmitter 29 and the receiver 30 according to a stored predetermined sequence to produce the X-axis gradient Gx, the Y-axis gradient Gy, the Z-axis gradient Gz and the RF signal.

In addition, the sequence controller 31 is configured to receive raw data, which is complex data derived by analog-to-digital (A/D) conversion from the NMR signal detected by the receiver 30, and provide the raw data to the computer 32.

Thus, the transmitter 29 has a function of providing the RF signal to the RF coil unit 24 based on the control information received from the sequence controller 31, and the receiver 30 has a function of generating raw data, which is digitized complex data, by detecting the NMR signal from the RF coil unit 24 and performing a required signal processing and an A/D conversion on the NMR signal and a function of providing the generated raw data to the sequence controller 31.

The magnetic resonance imaging apparatus 20 may further have an electrocardiogram (ECG) unit 38 that acquires an ECG signal from the object P. The ECG signal acquired by the ECG unit 38 is output to the computer 32 via the sequence controller 31.

As an alternative to the ECG signal, a peripheral pulse gating (PPG) signal that carries pulse wave information that indicates a pulsation may be acquired. For example, the PPG signal is an optical signal indicating a pulse wave detected from a finger tip. In the case of acquiring the PPG signal, a PPG signal detection unit is provided.

The computer 32 implements various functions by the calculating device 35 performing various programs stored in the storage device 36 in the computer 32. As an alternative to the programs, circuits dedicated for various functions may be provided in the magnetic resonance imaging apparatus 20.

Figure 2:
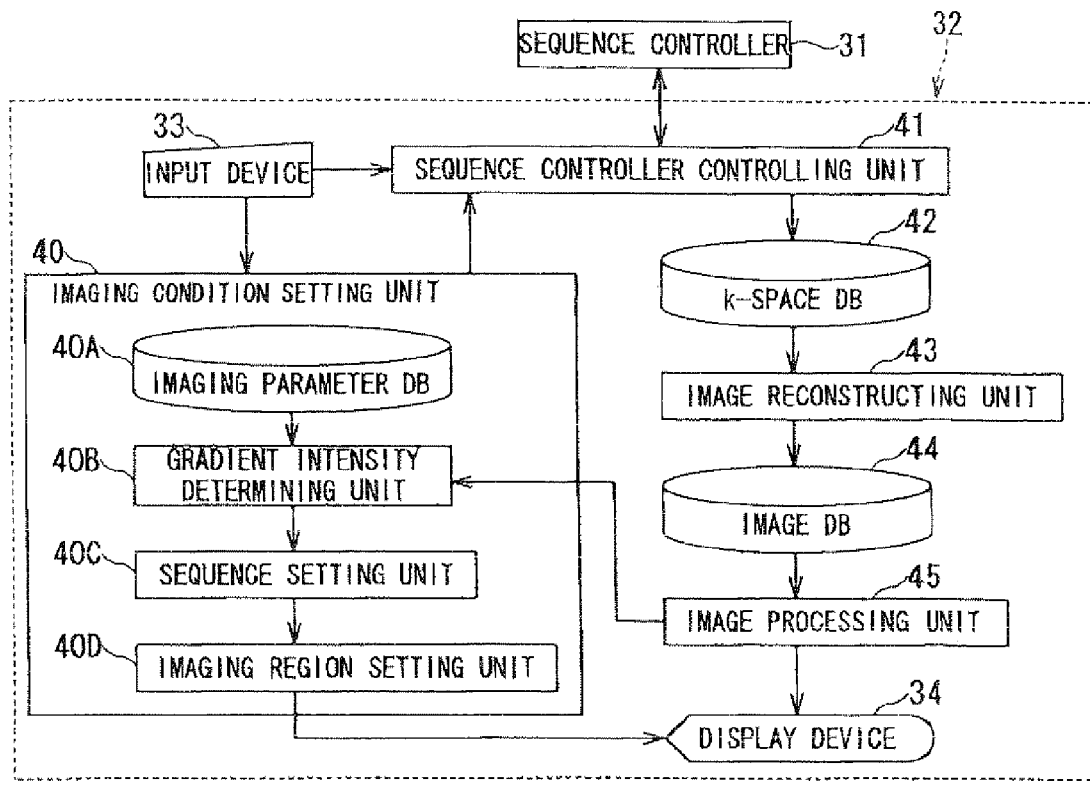
FIG. 2 is a functional block diagram showing a computer in the magnetic resonance imaging apparatus.

FIG. 2 is a functional block diagram of the computer 32 shown in FIG. 1.

Under the control of programs, the computer 32 functions as an imaging condition setting unit 40, a sequence controller controlling unit 41, a k-space database 42, an image reconstructing unit 43, an image database 44 and an image processing unit 45. The imaging condition setting unit 40 has an imaging parameter database 40A, a gradient intensity determining unit 40B, a sequence setting unit 40C and an imaging region setting unit 40D.

The imaging condition setting unit 40 sets an imaging condition including a pulse sequence based on instruction information from the input device 33 and provides the set imaging condition to the sequence controller controlling unit 41. As described later, the imaging condition setting unit 40 has a function of setting an imaging condition to acquire, in one non-contrast MRA imaging scan, a blood image only showing a blood flow extracted as bright blood and a blood vessel wall image primarily showing a static part including a blood vessel wall with the blood flow suppressed as black blood.

The non-contrast MRA methods include an imaging method that involves ECG gating (the FBI method, for example) and an imaging method that does not involve ECG gating. The FBI method is a non-contrast MRA method that repeatedly gathers echo data every multiple heart beats after a delay of a predetermined time from a trigger signal synchronized with a reference wave that represents a cardiac phase of the object P, such as an R wave, in a spin-echo (SE)-based sequence. SE-based sequences used in the FBI method include a fast asymmetric spin echo or fast advanced spin echo (EASE or FastASE) sequence or a fast spin echo (FSE) sequence. The FASE method is a fast data gathering method that uses a half Fourier method to interpolate part of k-space data based on a conjugate symmetry in the k-space. According to the FBI method, magnetization of a transverse relaxation (T2) component of blood is restored during the multiple heart beats, and thus, a T2 weighted image in which the T2 magnetization component of the blood is emphasized can be obtained. In addition, according to the FBI method, a three-dimensional image can be produced by gathering a predetermined amount of echo data (volume data) in a slice direction by performing a three-dimensional scan that involves encoding in the slice direction.

On the other hand, imaging methods that do not involve ECG gating include a time of flight (TOF) method and the SSFP method.

The imaging parameter database 40A stores the intensity of the flow dephasing pulse and the flow rephasing pulse for producing both a blood vessel wall image and a blood image with high quality. By appropriately setting the intensity of the dephasing pulse and the rephasing pulse, both the blood vessel wall image and the blood image can be produced with high quality. The dephasing pulse is referred to also as a spoiler gradient pulse. The rephasing pulse is referred to also as a flow compensation pulse. The appropriate intensity of the dephasing pulse and the rephasing pulse varies with the object, the part to be imaged, and the cardiac phase for data gathering. Thus, the imaging parameter database 40A stores the appropriate intensity of the dephasing pulse and the rephasing pulse in association with an imaging condition, such as a characteristic of the object such as the height and the weight, the part to be imaged and a cardiac phase for data gathering. The appropriate intensity of the dephasing pulse and the rephasing pulse for each imaging condition can be previously determined by pre-scan or simulation.

The imaging region setting unit 40D makes the display device 34 display a positioning image. In addition, the imaging region setting unit 40D sets a field of view (FOV) corresponding to a region of interest (set FOV) input by a user via the input device 33 with reference to the positioning image based. The FOV which is set by the user is referred to as a "set FOV" in this embodiment. Furthermore, in this embodiment, as described later, in order to appropriately separate the blood vessel wall image and the blood image, the size of a FOV in a phase encoding direction is larger than (twice, for example) that of the set FOV. This FOV is set in the apparatus from the set FOV. Data used for actual image production is gathered based on an imaging parameter, such as a phase encoding number and a phase encoding interval, that is determined by the FOV set in the apparatus. Thus, the FOV is referred to as a "gathering FOV".

When the user sets the set FOV via a graphical user interface (GUI) or the like, the computer 32 automatically sets the gathering FOV in a user-transparent manner.

Alternatively, a plurality of candidates for the gathering FOV may be displayed on the display device 34, and the user may select from among the candidates by manipulating the input device 33. Alternatively, the user may manually set the gathering FOV by manipulating the input device 33. Alternatively, the user may adjust the size of the gathering FOV automatically set by the apparatus by manipulating the input device 33.

(Operation)
(First Embodiment)

Figure 3:
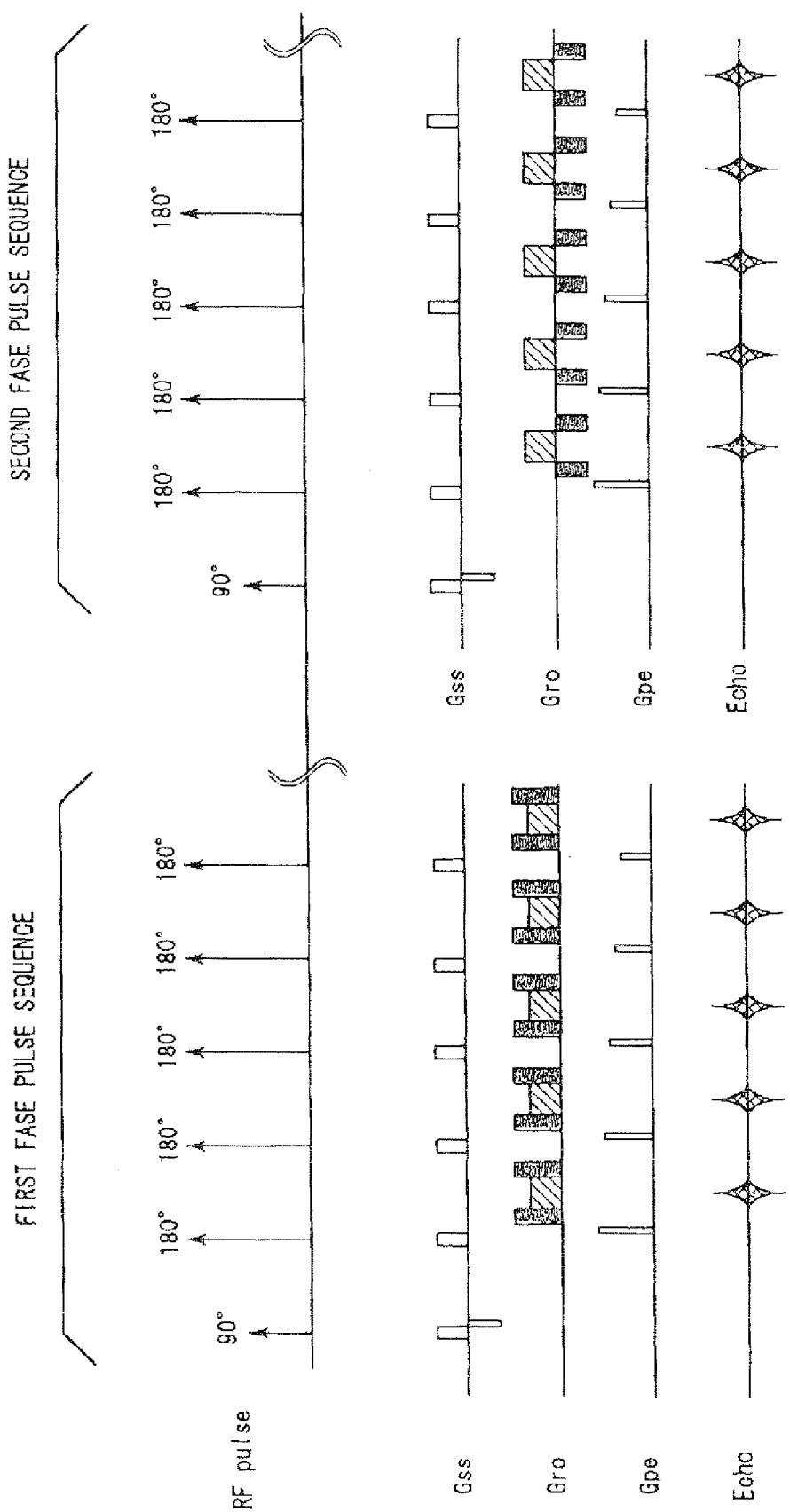
FIG. 3 is a diagram showing an example of a pulse sequence according to a first embodiment.

FIG. 3 is a diagram showing an example of a pulse sequence used by a magnetic resonance imaging apparatus 20 according to a first embodiment. In this example, a FASE pulse sequence is used. The pulse sequence used in the magnetic resonance imaging apparatus 20 is not limited to the FASE sequence, but other pulse sequences such as SSFP can be used.

In FIG. 3, the graph shown in the top row in the drawing schematically shows an RF pulse, the graph shown in the second row from the top schematically shows a slice selecting gradient Gss, the graph shown in the third row schematically shows a readout gradient Gro, the graph shown in the fourth row schematically shows a phase encoding gradient Gpe, and the graph shown in the fifth row schematically shows an echo signal.

In particular, a characteristic of the magnetic resonance imaging apparatus 20 according to the first embodiment consists in the readout gradient Gro shown on the third line. For a first FASE pulse sequence shown in the left half of FIG. 3, each pulse of the readout gradient Gro has a pulse main body and a preceding flow dephasing pulse and a following flow dephasing pulse added to the pulse main body (such a pulse of the readout gradient Gro will be referred to as a "dephasing RO pulse" hereinafter). For a second FASE pulse sequence shown in the right half of FIG. 3, each pulse of the readout gradient Gro has a pulse main body and a preceding flow rephasing pulse and a following flow rephasing pulse added to the pulse main body (such a pulse of the readout gradient Gro will be referred to as a "rephasing RO pulse" hereinafter).

Figure 4:
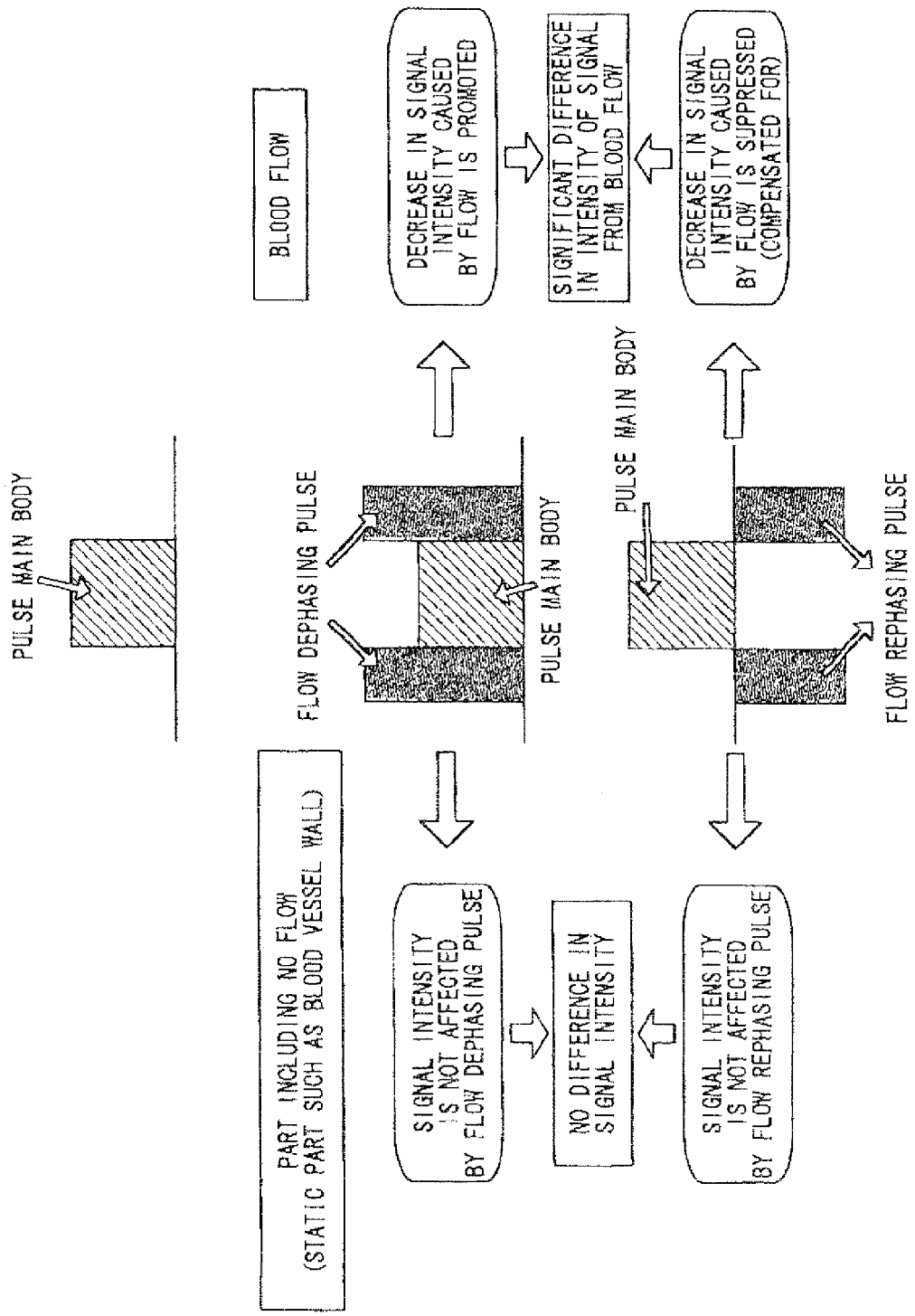
FIG. 4 is a conceptual diagram showing a dephasing RO pulse and a rephasing RO pulse.

FIG. 4 includes enlarged views of these pulses: the diagram shown at the top of the drawing is an enlarged view of the pulse main body of the pulse of the readout gradient Gro, the diagram shown in the middle of the drawing is an enlarged view of the dephasing RO pulse, and the diagram shown at the bottom of the drawing is an enlarged view of the rephasing RO pulse.

Both the two flow dephasing pulses and the two flow rephasing pulses are symmetrically added to the pulse main body. Therefore, in the FASE pulse sequences shown in FIG. 3, the zero-order moment of the magnetic field between adjacent 180-degree pulses is zero for both the dephasing RO pulse and the rephasing RO pulse. As a result, an MR signal from a static part including a blood vessel wall (a region that includes no blood flow or other flows) is not affected by the addition of the flow dephasing pulses or the flow rephasing pulses and has a same intensity for the dephasing RO pulse and the rephasing RO pulse in principle.

On the other hand, the first-order moment of the magnetic field between adjacent 180-degree pulses varies between the dephasing RO pulse and the rephasing RO pulse. Therefore, the intensity of an MR signal from flowing blood or, in other words, a blood flow varies between the dephasing RO pulse and the rephasing RO pulse. The dephasing RO pulse promotes the decrease of the signal intensity (a flow void effect)

caused by the flow. On the other hand, the rephasing RO pulse suppresses (compensates for) the decrease of the signal intensity (the flow void effect) caused by the flow.

In the first embodiment, echo signals in the first FASE pulse sequence using the dephasing RO pulse and echo signals in the second FASE pulse sequence using the rephasing RO pulse are periodically arranged in the phase encoding direction in the k-space. That is, a first and a second readout gradient that have a zero-order moment of 0 but have different first-order moments are applied, and a first MR signal obtained as a result of the application of the first readout gradient and a second MR signal obtained as a result of the application of the second readout gradient are periodically arranged in the phase encoding direction in the k-space.

Figure 5:
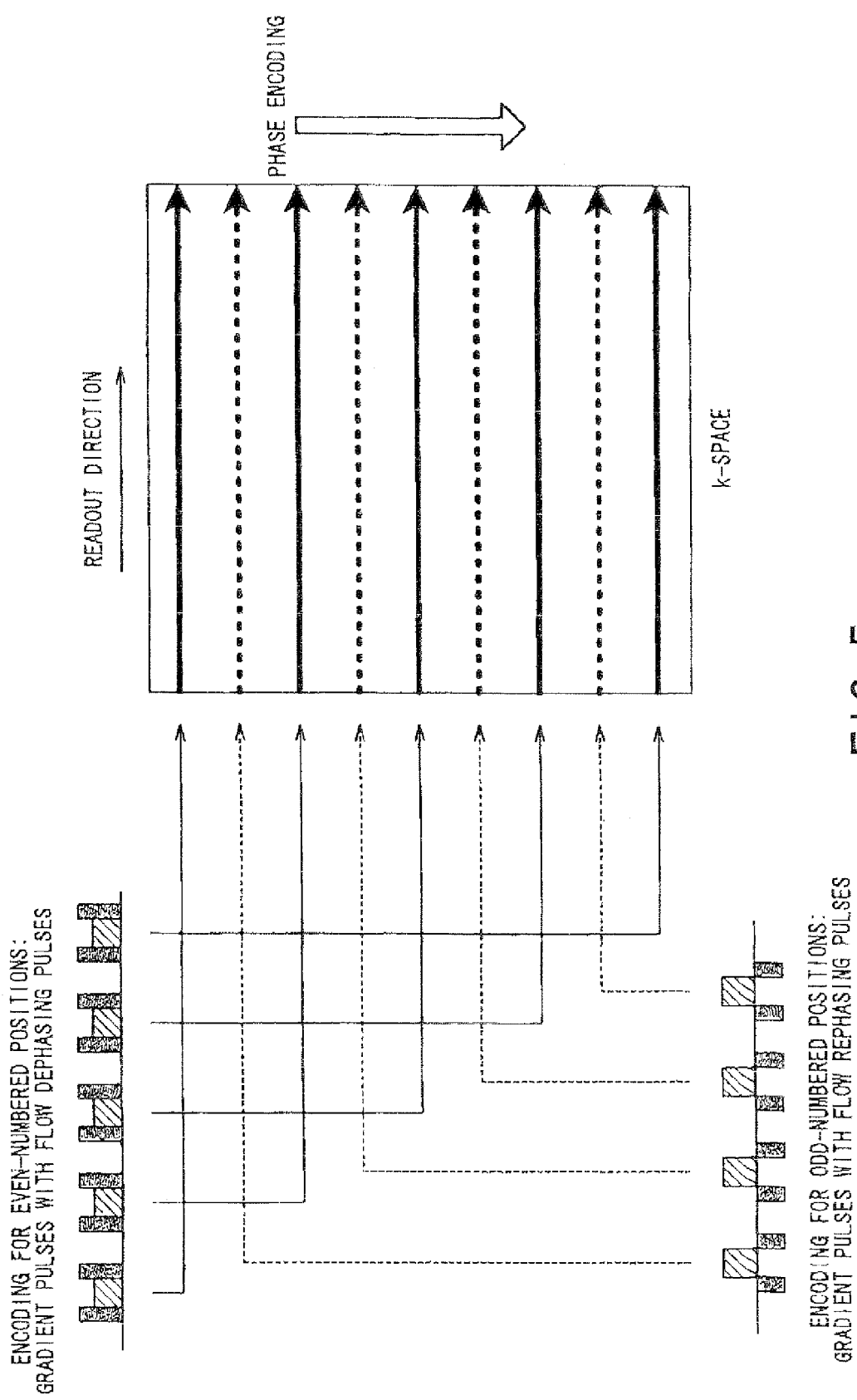
FIG. 5 is a diagram showing an arrangement in a k-space of first MR signals read out with dephasing RO pulses and second MR signals read out with rephasing RO pulses.

More specifically, as shown in FIG. 5, first MR signals obtained as a result of the application of the dephasing RO pulse (signals shown by the solid lines in the k-space in FIG. 5) are arranged at even-numbered positions in the phase encoding direction, and second MR signals obtained as a result of the application of the rephasing RO pulse (signals shown by the dotted lines in the k-space in FIG. 5) are arranged at odd-numbered positions in the phase encoding direction. Alternatively, the first MR signals may be arranged at odd-numbered positions, and the second MR signals may be arranged at even-numbered positions.

The first and second MR signals from the blood flow have different intensities, and therefore, the MR signals from the blood flow have a periodicity in the phase encoding direction. On the other hand, the first and second MR signals from the static part such as the blood vessel wall have equal intensities, and therefore, the MR signals from the static part do not have a periodicity in the phase encoding direction.

Figure 6:
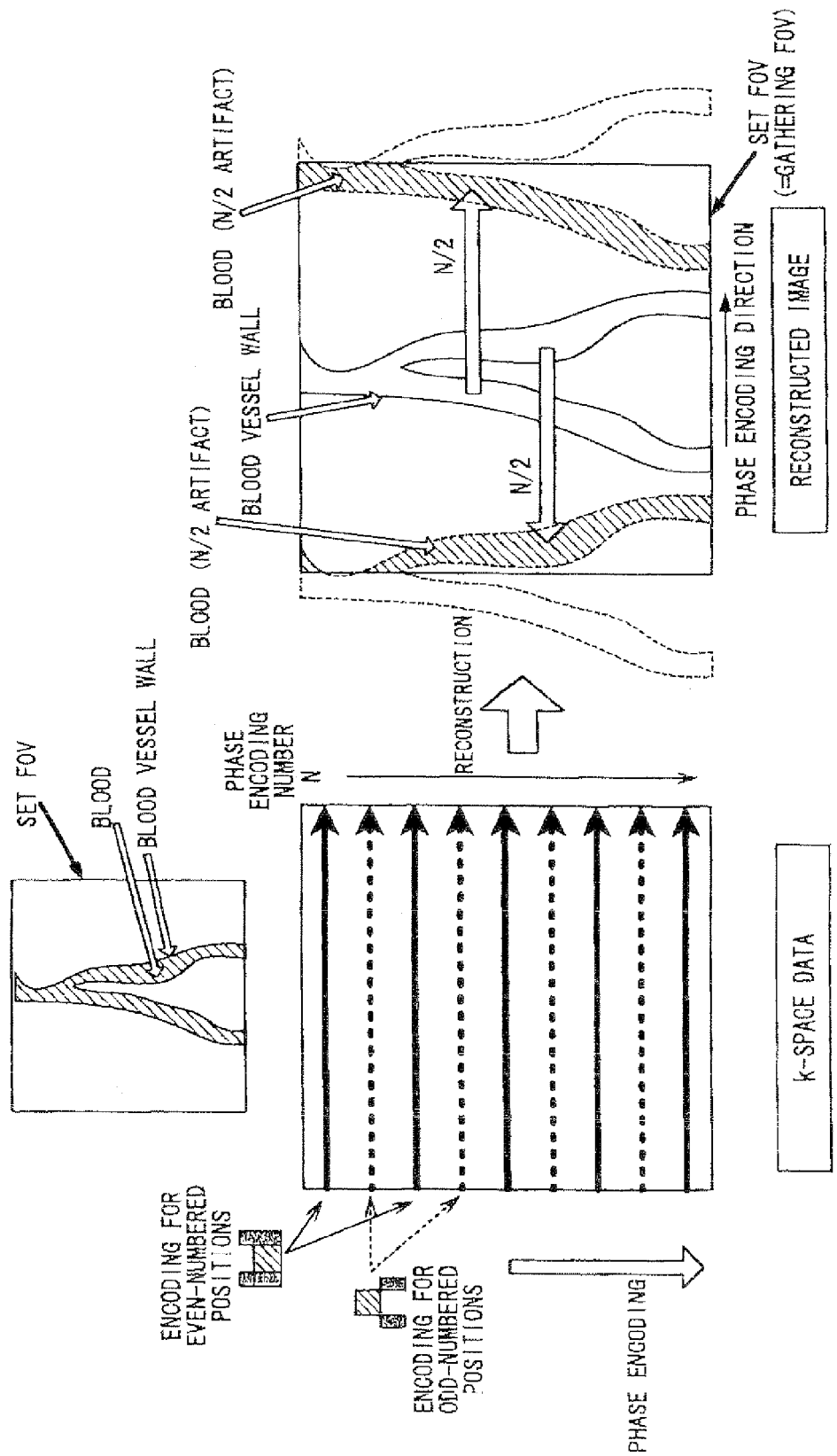
FIG. 6 is a diagram for illustrating shifting of a blood image due to a periodic arrangement of the first MR signals and the second MR signals.

FIG. 6 illustrates k-space data obtained from an imaging region (set FOV) including a blood flow and a blood vessel wall, and an image reconstructed by performing an inverse Fourier transform on the k-space data. As described above, since the intensity of the MR signals from the blood flow periodically varies between the even-numbered row and the odd-numbered row in the phase encoding direction, the blood image in the reconstructed image is shown as a ghost image shifted by N/2 from the position in the blood vessel (the position of the actual blood flow image) in the phase encoding direction.

The ratio of the signal intensity between the actual blood flow image and the ghost image depends on the intensity of the first and second MR signals. Typically, as the difference in intensity between the first and second MR signals increases, the signal intensity of the actual blood flow decreases, and the signal intensity of the ghost image increases accordingly.

The ghost image appears in the reconstructed image at a position shifted by N/2 in the phase encoding direction, where N represents the phase encoding number. Therefore, the ghost image is commonly referred to also as a N/2 artifact. In normal imaging, the N/2 artifact is unwanted and needs to be suppressed.

However, in the first embodiment (and other embodiments), by alternately using the dephasing RO pulse and the rephasing RO pulse, a significant N/2 artifact is produced by design to shift the blood flow image by N/2 from the actual position.

On the other hand, the blood vessel wall image is not shifted from the actual position. This is because, as described above, the intensity of the MR signals from the static part including the blood vessel wall does not vary between the dephasing RO pulse and the rephasing RO pulse and therefore has no periodicity in the phase encoding direction.

As a result, as shown in FIG. 6, an image in which a static part including a blood vessel wall and a blood flow in the blood vessel are separated and shown at different positions can be reconstructed from k-space data obtained by one imaging.

(Second Embodiment)

In the first embodiment, the first MR signals using the dephasing RO pulses and the second MR signals using the rephasing RO pulses are periodically arranged in the phase encoding direction in the k-space, thereby shifting the blood image in the reconstructed image in the phase encoding direction. The degree of shifting depends on the periodicity in the phase encoding direction in the k-space, and the amount of shifting increase as the period becomes shorter. Thus, the amount of shifting is maximized by minimizing the period between the first MR signal and the second MR signal or, more specifically, by arranging the first MR signals at even-numbered positions and the second MR signals at odd-numbered positions in the phase encoding direction. However, even in this case, the amount of shifting of the blood image is a half of the size N of the set FOV in the phase encoding direction (see the reconstructed image in FIG. 6), and therefore, the shifted blood image overlaps with the set FOV, and the blood image and the blood vessel wall image are not completely separated from each other.

Thus, according to a second embodiment, as shown in the left part of FIG. 7B, oversampling in the phase encoding direction is used to make the phase encoding interval narrower than the phase encoding interval determined by the set FOV and make the phase encoding number larger than the phase encoding number determined by the set FOV. For example, if the phase encoding number determined by the set FOV is N (which is the value in the first embodiment shown in FIG. 7A), the phase encoding number used in the second embodiment is 2N, which is twice as large as N.

That is, the period between the first MR signal using the dephasing RO pulse and the second MR signal using the rephasing RO pulse is set to be a half of the period in the first embodiment.

As a result, the amount of shifting of the blood image in the reconstructed image is N, which is twice as large as the amount of shifting in the first embodiment, so that the blood image is shifted to the outside of the set FOV and does not overlap with the set FOV. Therefore, the blood vessel wall image in the set FOV and the blood image outside the set FOV can be completely separated from each other.

In the second embodiment, the size of the set FOV set by the user differs from the size of the gathering FOV that determines an imaging parameter (such as the phase encoding number and the phase encoding interval) for gathering actual data. The gathering FOV is twice as large as the set FOV in the phase encoding direction, for example.

The set FOV and the gathering FOV may be individually set by the user. However, if the user sets only the set FOV, and the apparatus automatically determines the gathering FOV based on the set FOV, the operation burden on the user can be reduced. In this case, the imaging region setting unit 40D in the imaging condition setting unit 40 determines the gathering FOV.

Figures 8A, 8B, 8C:
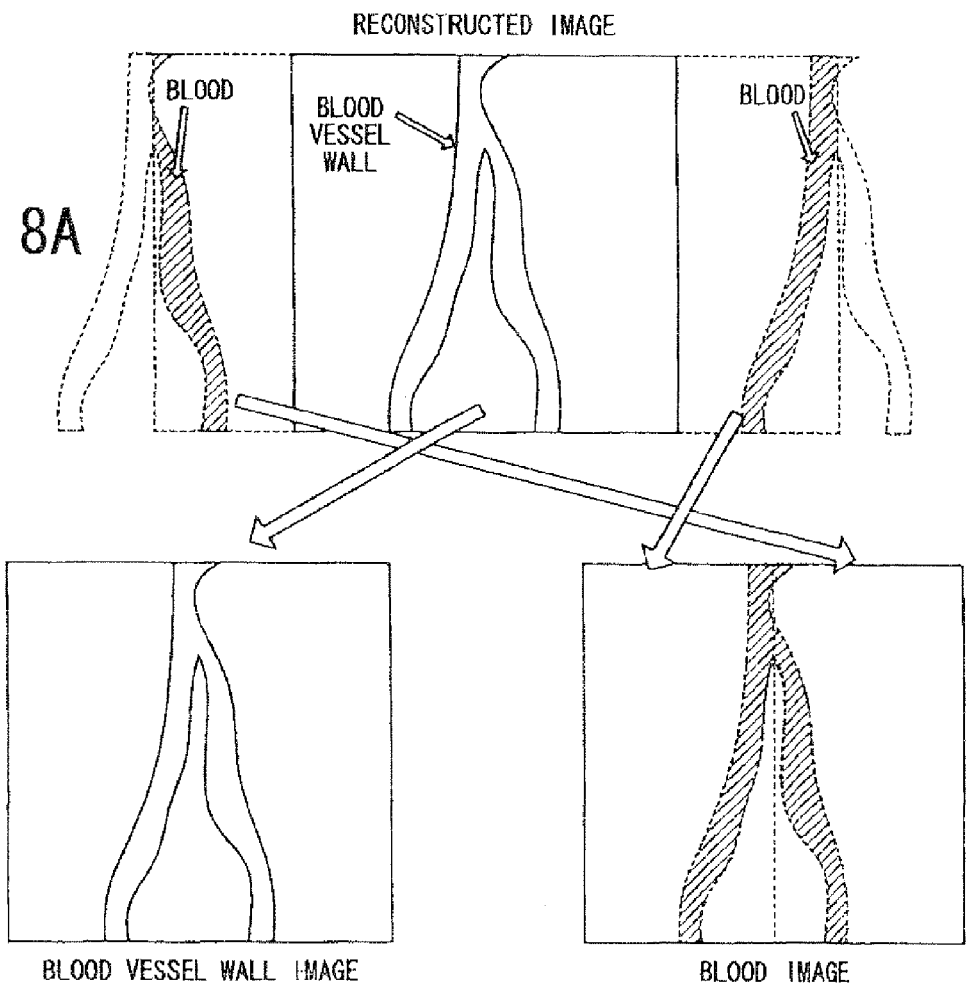
FIGS. 8A to 8C include diagrams for illustrating a concept of separately extracting a blood vessel wall image and the blood image from a reconstructed image having an expanded FOV.

As shown in FIG. 8A, in the second embodiment, the blood vessel wall image and the blood image are separated from each other in the reconstructed image.

Thus, the set FOV at the center of the reconstructed image can be extracted to produce a blood vessel wall image (FIG. 8B), and a left quarter region and a right quarter region of the reconstructed image can be extracted and combined with each other to form a blood image (FIG. 8C). Thus, a blood image in which only the blood is visualized (a first image) and a blood vessel wall image in which the static part including the blood vessel wall is visualized (a second image) can be obtained at the same time from the reconstructed image obtained by one imaging.

More simply, the blood vessel wall image and the blood image may be obtained by scrolling the reconstructed image to the right or left by a quarter of the width of the image to form a complete blood image on one side of the reconstructed image and dividing the resulting reconstructed image into a left half image and a right half image at the center thereof.

The oversampling rate is not necessarily limited to the two-fold described above. Supposing that the encoding interval compared with the normal encoding interval in the case where oversampling is not used is 1/M (M represents a real number), as the value M increases beyond 1, the amount of shifting of the blood image, which is the ghost image, increases, and the blood image and the blood vessel wall image can be more easily separated from each other. However, if the encoding interval is reduced to 1/M, the phase encoding number has to be increased by a factor of M in order to maintain the resolution. Therefore, imaging takes a longer time. Depending on the distribution of blood vessels in the set FOV, the blood vessel wall image and the blood image may be separated without significantly shifting the blood image. Therefore, the value M can be determined by considering the distribution of blood vessels in the set FOV, the imaging time, the required resolution, and the like.

Figure 9:
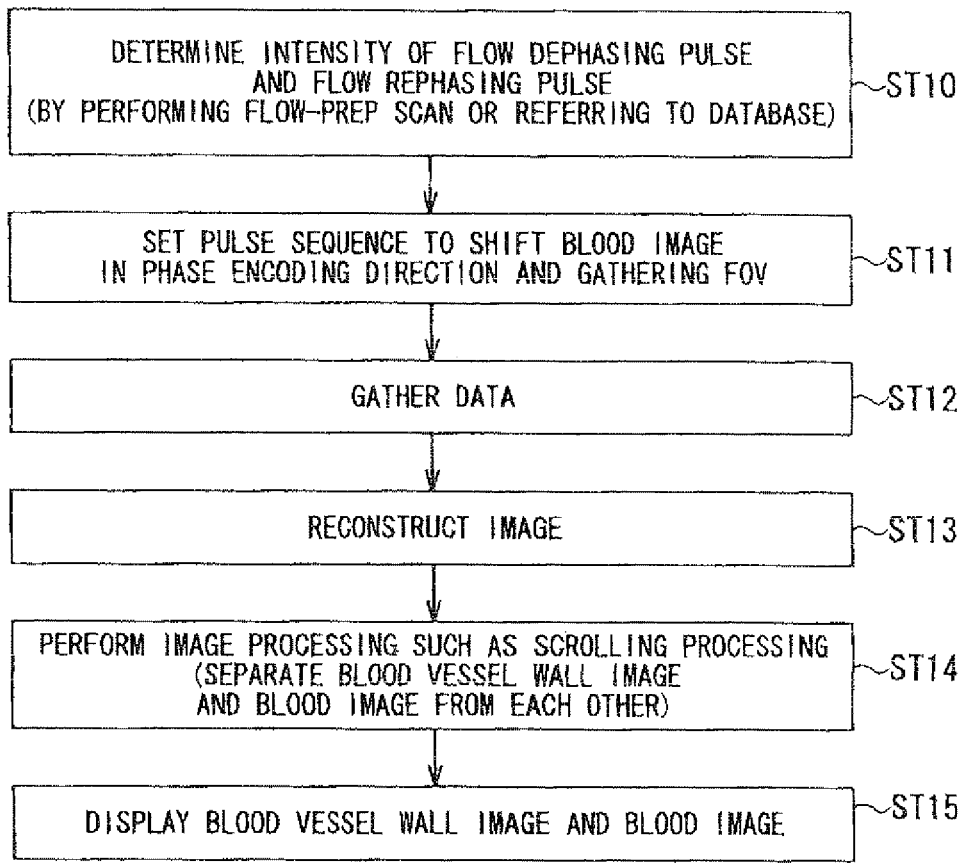
FIG. 9 is a flowchart for illustrating a flow of a process performed by the magnetic resonance imaging apparatus.

FIG. 9 is a flowchart simply illustrating a flow of a process according to the first and second embodiments described above.

In step ST10, the intensity of the flow dephasing pulse and the flow rephrasing pulse added to the pulse main body of the readout gradient pulse is determined. The intensity of the flow dephasing pulse and the flow rephrasing pulse is determined with reference to a database, for example.

The optimal intensity of the dephasing pulse and the rephasing pulse depends on the speed of the blood flow and therefore varies with the height, the weight or the part to be imaged of the patient. In the case of an imaging method that involves cardiac phase gating, the optimal intensity varies with the cardiac phase, such as the diastolic phase and the systolic phase. Thus, the imaging parameter database 40A in the imaging condition setting unit 40 stores the optimal intensities of the flow dephasing pulse and the flow rephasing pulse in association with the part to be imaged and the cardiac phase of the patient, and the optimal intensity is determined with reference to the database in step ST10.

Alternatively, a flow-prep scan may be performed in advance of the imaging scan (primary scan), and the optimal intensity of the flow dephasing pulse and the flow rephasing pulse may be determined based on the result of the flow-prep scan. A pre-scan performed to determine the intensity of the flow dephasing pulse and the flow rephasing pulse is referred to as the flow-prep scan herein.

The flow-prep scan is a pre-scan that involves performing imaging while setting the intensity of the flow dephasing pulse and the flow rephasing pulse at a plurality of different values. In order to reduce the time for the pre-scan, the flow-prep scan is preferably a two-dimensional (2D) scan for a single slice. In addition, in order to properly determine the intensity of the dephasing pulse and the rephasing pulse, a pulse sequence equivalent to that used in the imaging scan is preferably used in the flow-prep scan. The pulse sequence for the flow-prep scan is set by the sequence setting unit 40C.

Figure 10:
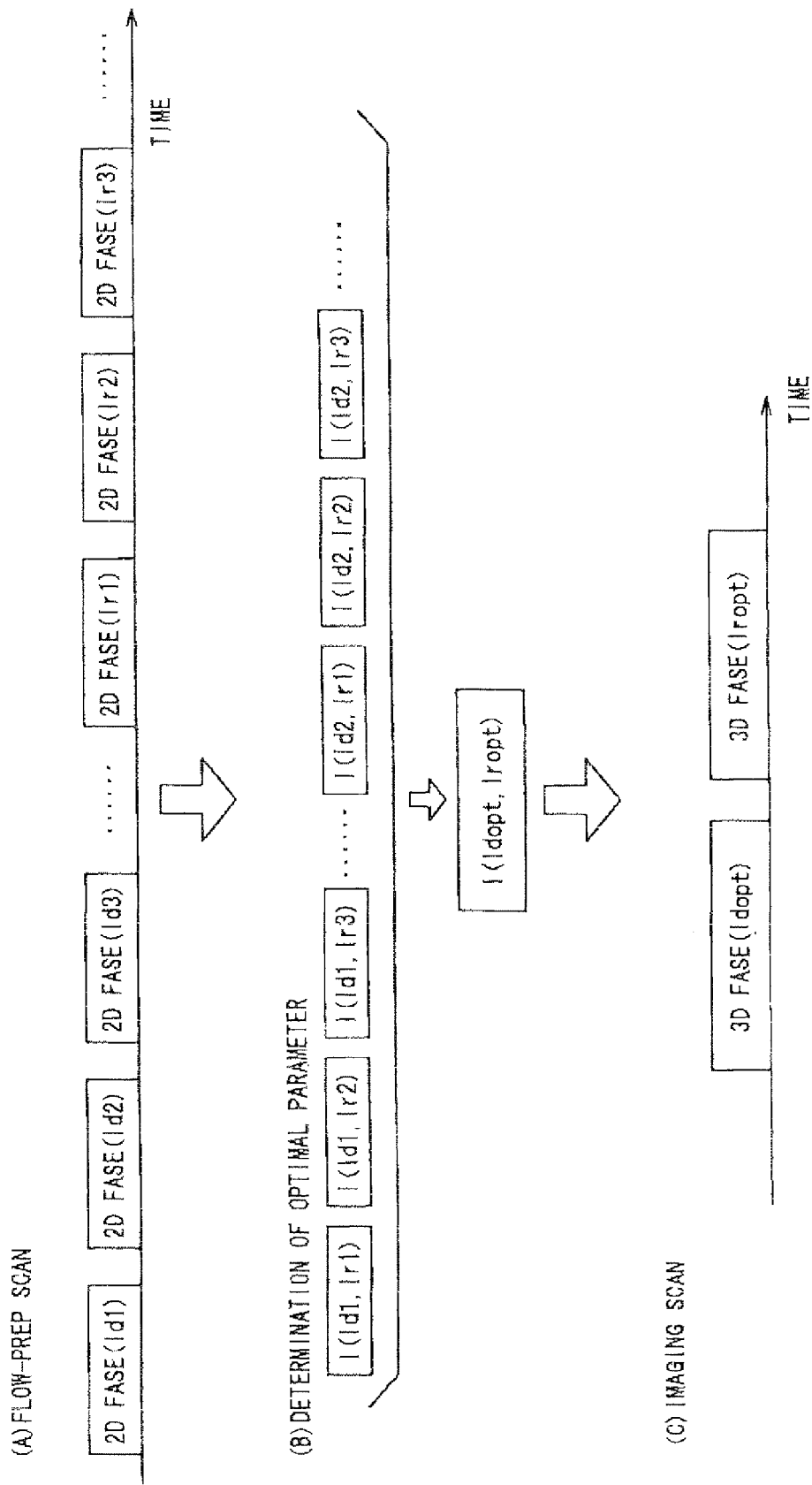
FIG. 10 is a diagram for illustrating a method of determining the intensity of a flow dephasing pulse and a flow rephasing pulse by performing flow-prep scan.

FIG. 10 includes diagrams for illustrating an example of a process of determining the optimal intensity of the flow dephasing pulse and the flow rephasing pulse by performing the flow-prep scan.

As shown in FIG. 10(A), for example, the intensity of the dephasing pulse and the intensity of the rephasing pulse are set at a set of values Id1, Id2, Id3 and so on and a different set of values Ir1, Ir2, Ir3 and so on, respectively, and the flow-prep scan is performed according to two-dimensional pulse sequences 2D FASE(Id1), 2D FASE(Id2), 2D FASE(Id3) and so on and 2D FASE(Ir1), 2D FASE(Ir2), 2D FASE(Ir3) and so on.

Then, echo data gathered according to the pulse sequences shown in FIG. 10(A) is reconstructed to form a plurality of images I(Id1, Ir1), I(Id2, Ir2), I(Id3, Ir3) and so on corresponding to the intensities of the dephasing pulse and the rephasing pulse as shown in FIG. 10(B). Then, the display device 34 displays the images, and the user visually selects an image I(Idopt, Iropt) in which the blood vessel wall and the blood are most appropriately visualized and inputs identification information on the selected image to the gradient intensity determining unit 40B via the input device 33. Then, the gradient intensity determining unit 40B determines the intensities of the dephasing pulse and the rephasing pulse corresponding to the selected image data I(Idopt, Iropt) as the optimal intensities Idopt and Iropt.

As an alternative to the visual check by the user, an image processing, such as an edge reinforcement processing and a threshold processing, may be performed on the plurality of pieces of image data I(Id1, Ir1), I(Id2, I(Id3, Ir3) and so on, and image data I(Idopt, Iropt) having an appropriate contrast may be automatically detected. The gradient intensity determining unit 40B can have the capability of automatically selecting the image data I(Idopt, Iropt) having an appropriate contrast.

Once the optimal intensity Idopt of the dephasing pulse and the optimal intensity Iropt of the rephasing pulse are determined, data is gathered by performing the imaging scan based on the determined dephasing pulse and rephasing pulse in step ST12 in FIG. 9 (see also FIG. 10(C)). The data gathering is performed based on the gathering FOV expanded in the phase encoding direction.

Then, an inverse Fourier transform is performed on the gathered k-space data to produce the reconstructed image such as that shown in FIG. 8A (step ST13).

Then, an image processing, such as a scrolling processing, is performed to separate the blood vessel wall image (FIG. 8B) and the blood image (FIG. 8C) from each other (step ST14), and the display device 34 displays the resulting images.

(Third Embodiment)

Figure 11:
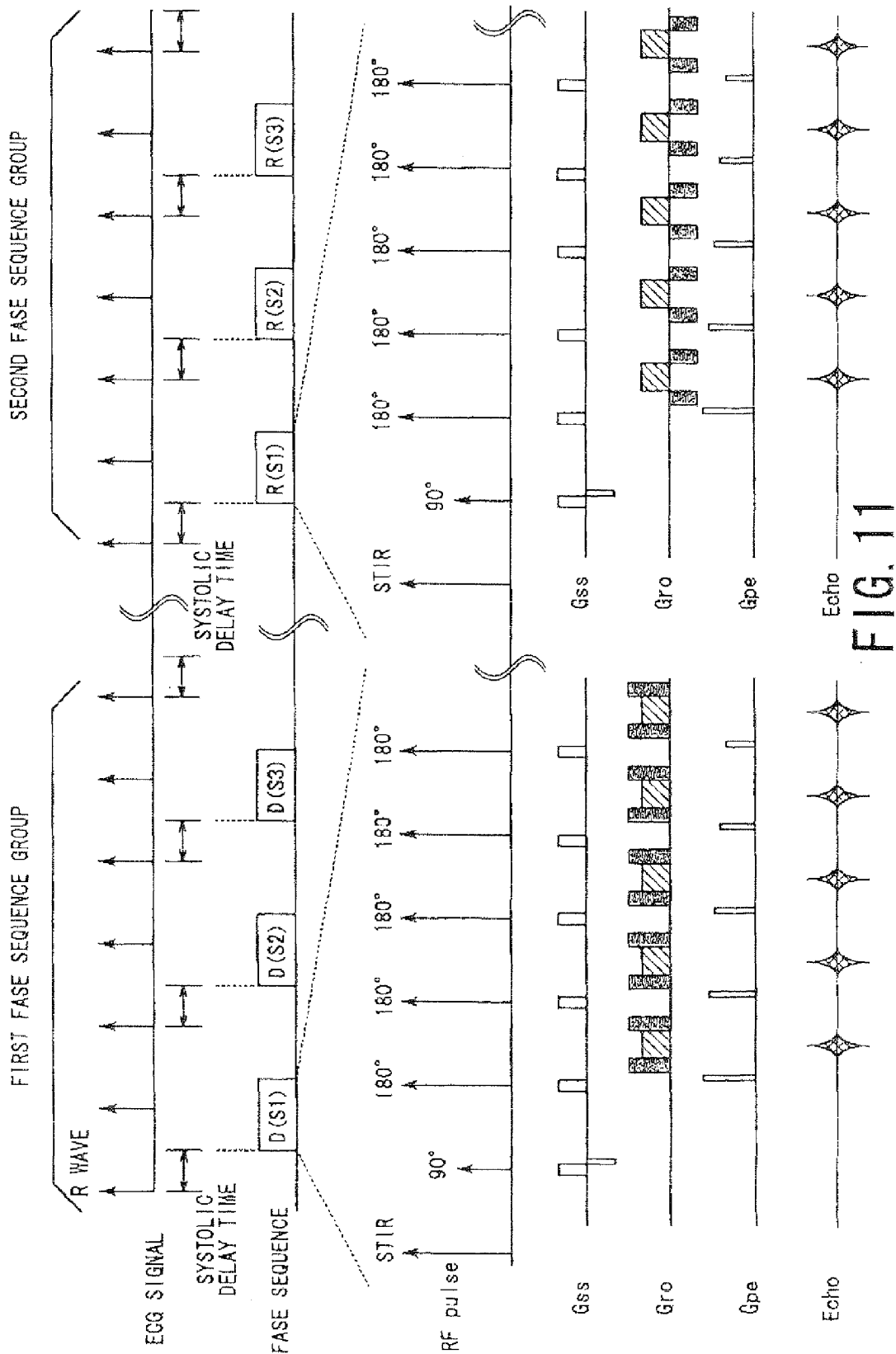
FIG. 11 is a diagram showing an example of a pulse sequence using electrocardiogram gating.

FIG. 11 is a diagram showing an example of a pulse sequence according to a third embodiment. According to the third embodiment, a blood vessel wall image and a blood image are obtained by one imaging based on an ECG-gated method using an ECG signal.

In FIG. 11, the graph shown in the top row in the drawing shows an RF wave trigger derived from the ECG signal, the graph shown in the second row from the top shows a FASE sequence, the graph shown in the third row shows an RF pulse, the graph shown in the fourth row shows a slice selecting gradient Gss, the graph shown in the fifth row shows an RO gradient Gro, the graph shown in the sixth row shows a phase encoding gradient Gpe, and the graph shown in the seventh row shows an echo signal.

As shown in FIG. 11, a first FASE sequence group using a dephasing RO pulse having a pulse main body and flow dephasing pulses added to the pulse main body is applied first, and then, a second FASE sequence group using a rephasing RO pulse having a pulse main body and flow rephasing pulses added to the pulse main body is applied. The first FASE sequence group involves application of the dephasing pulses and is composed of FASE sequences D(S1), D(S2), D(S3), . . . , D(Sn) corresponding to a plurality of slice encodings S1, S2, S3, . . . , Sn. The second FASE sequence group involves application of the rephasing pulses and is composed of FASE sequences R(S1), R(S2), R(S3), . . . , R(Sn) corresponding to the plurality of slice encodings S1, S2, S3, . . . , Sn.

Each of the FASE sequences D(S1), D(S2), D(S3), . . . , D(Sn) and R(S1), R(S2), R(S3), . . . , R(Sn) is applied in synchronization with an ECG signal. More specifically, the delay time of the ECG signal from the R wave is set so that data is gathered during a systolic phase in which the blood flow speed is high. This is because, when the blood flow speeds is high, the difference in intensity between the first MR signal obtained as a result of application of the dephasing RO pulse and the second MR signal obtained as a result of application of the rephasing RO pulse is large, and therefore, the contrast of the blood image, which appears as the ghost image, is high.

Alternately, in the second FASE sequence group, in which the rephasing RO pulses are applied, the delay time from the R wave may be set so that the data is gathered during a diastolic phase in which the blood flow speed is low, while in the first FASE sequence group, in which the dephasing RO pulses are applied, the delay time form the r wave is set so that the data is gathered during the systolic phase.

In each of the FASE sequences D(S1), D(S2), D(S3), . . . , D(Sn) in the first FASE sequence group, a short TI inversion recovery (STIR) pulse is applied as a fat suppression RF pulse, for example. Then, a plurality of 180-degree refocusing pulses following a 90-degree excitation pulse are applied. The dephasing RO pulse with the flow dephasing pulses is applied between adjacent 180-degree refocusing pulses. The phase encoding amount of the phase encoding gradient pulse Gpe is set at a discrete values so that pieces of data on even-numbered data gathering lines in the PE direction in the k-space are sequentially gathered. Then, echo signals (MR signals) read out with the dephasing RO pulses for the phase encoding amounts are sequentially arranged at even-numbered positions in the k-space.

Similarly, in each of the FASE sequences R(S1), R(S2), R(S3), . . . , R(Sn) in the second FASE sequence group, an STIR pulse is applied as a fat suppression RF pulse, for example. Then, a plurality of 180-degree refocusing pulses following a 90-degree excitation pulse are applied. The rephasing RO pulse with the flow rephasing pulses is applied between adjacent 180-degree refocusing pulses. The phase encoding amount of the phase encoding gradient pulse Gpe is set so that pieces of data on odd-numbered data gathering lines in the PE direction in the k-space are sequentially gathered. Then, echo signals (MR signals) read out with the rephasing RO pulses for the phase encoding amounts are sequentially arranged at odd-numbered positions in the k-space.

The procedure following the arrangement of the echo signals in the k-space is the same as that in the first and second embodiments, and therefore, descriptions thereof will be omitted.

(Other Embodiments)

Figure 12:
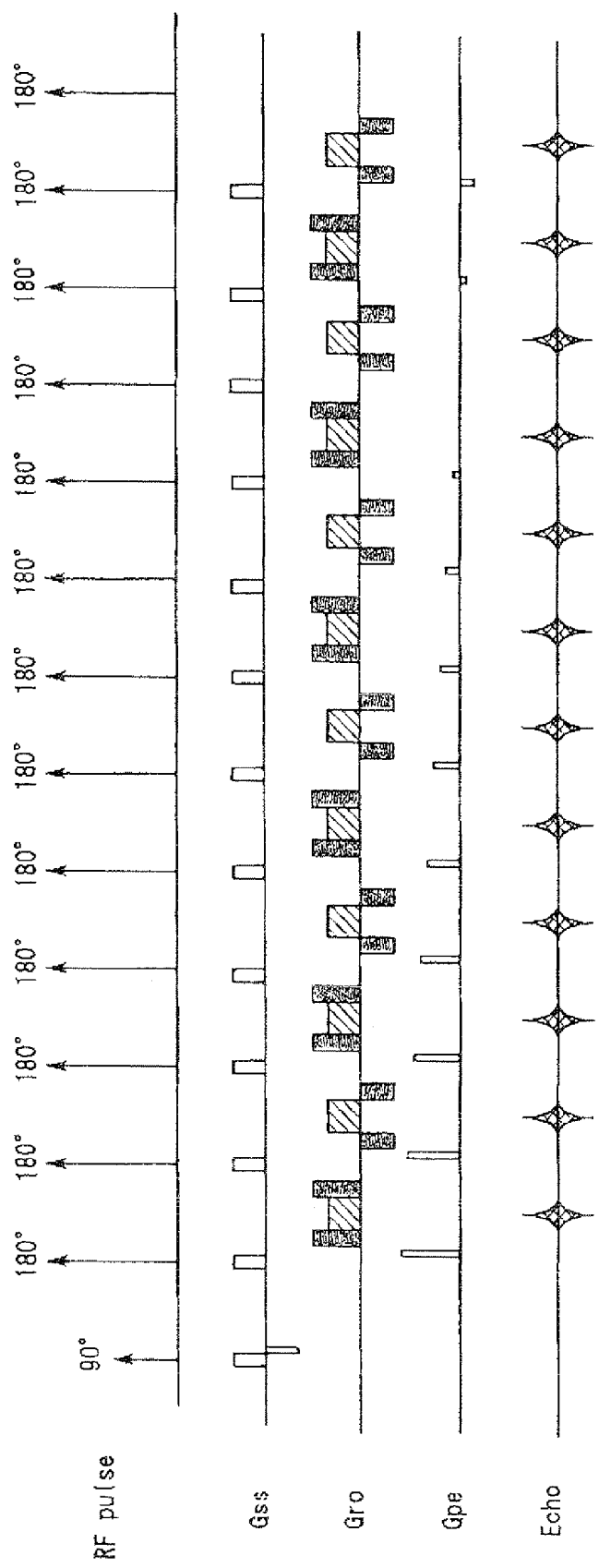
FIG. 12 is a diagram showing an example of a pulse sequence in which dephasing RO pulses and rephasing RO pulses are alternately applied.

In the pulse sequences described above, dephasing RO pulses or rephasing RO pulses are successively applied between adjacent 180-degree refocusing pulses. However, in the pulse sequence shown in FIG. 12, dephasing RO pulses and rephasing RO pulses are alternately applied between adjacent 160-degree refocusing pulses. In this case also, the first MR signals read out with the dephasing RO pulses are arranged at even-numbered positions (or odd-numbered positions) in the phase encoding direction in the k-space, and the second MR signals read out with the rephasing RO pulses are arranged at odd-numbered positions (or even-numbered positions) in the phase encoding direction in the k-space.

Figure 13:
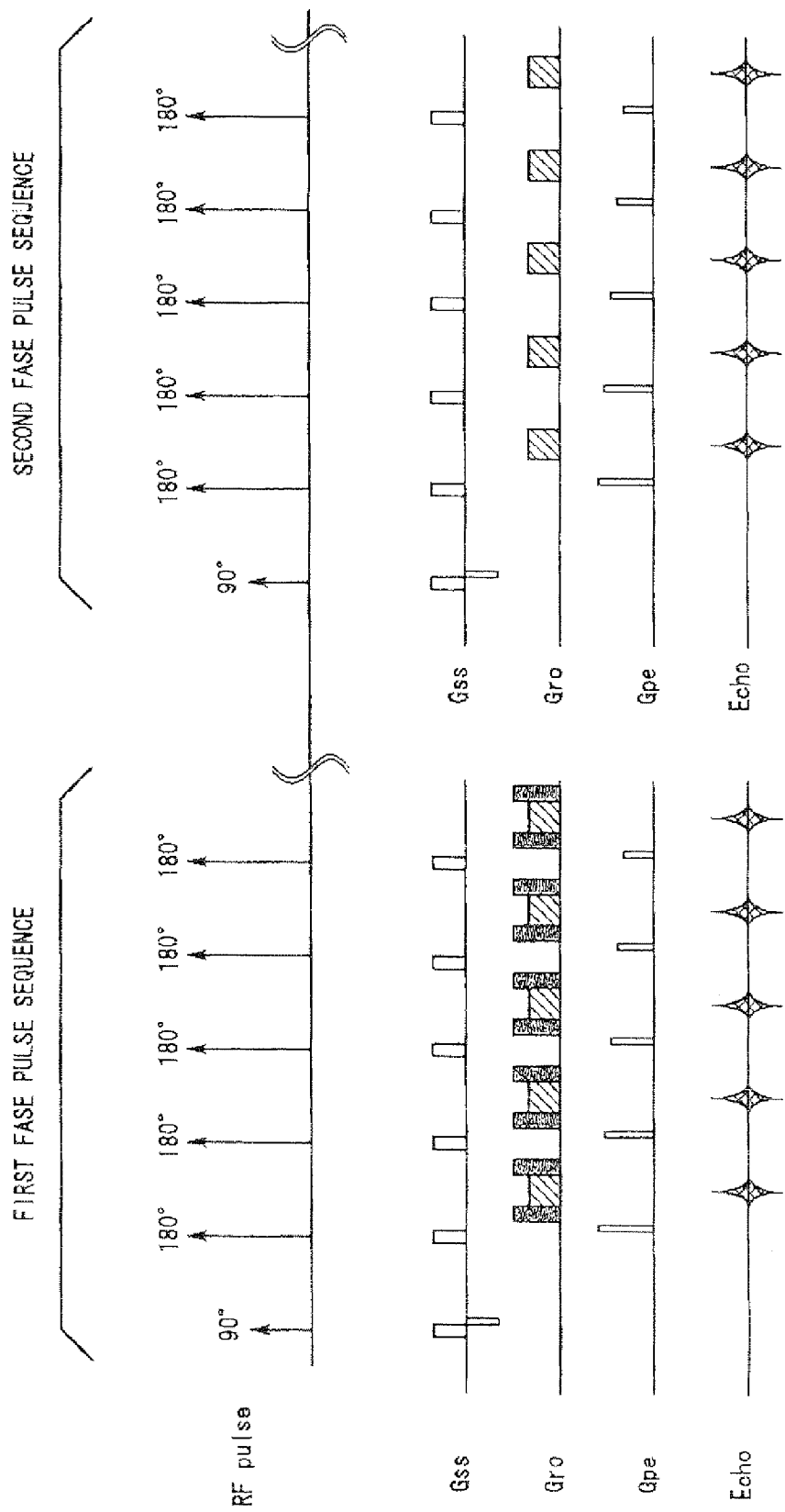
FIG. 13 is a diagram showing an example of a pulse sequence in which dephasing RO pulses and pulse main bodies are alternately applied.

FIG. 13 shows a pulse sequence in which the rephasing RO pulses in FIG. 3 are replaced with the pulse main bodies (the pulse main body is the rephasing RO pulse with the flow rephasing pulses on the opposite sides removed). The dephasing RO pulses are not changed. In this case, the first MR signals read out with the dephasing RO pulses are arranged at even-numbered positions (or odd-numbered positions) in the phase encoding direction in the k-space, and the second MR signals read out with the pulse main bodies are arranged at odd-numbered positions (or even-numbered positions) in the phase encoding direction in the k-space.

If the rephrasing RO pulses are replaced with the pulse main bodies, the difference in intensity between the first MR signal and the second MR signal is smaller than that in the case where both the dephasing RO pulses and the rephrasing RO pulses are used. However, even in this case, for a part to be imaged in which the blood flow speed is high or a cardiac phase in which the blood flow speed is high, the difference in intensity between the first MR signal and the second MR signal can be increased, and thus, the blood vessel wall image and the blood image can be separated from each other.

Figure 14:
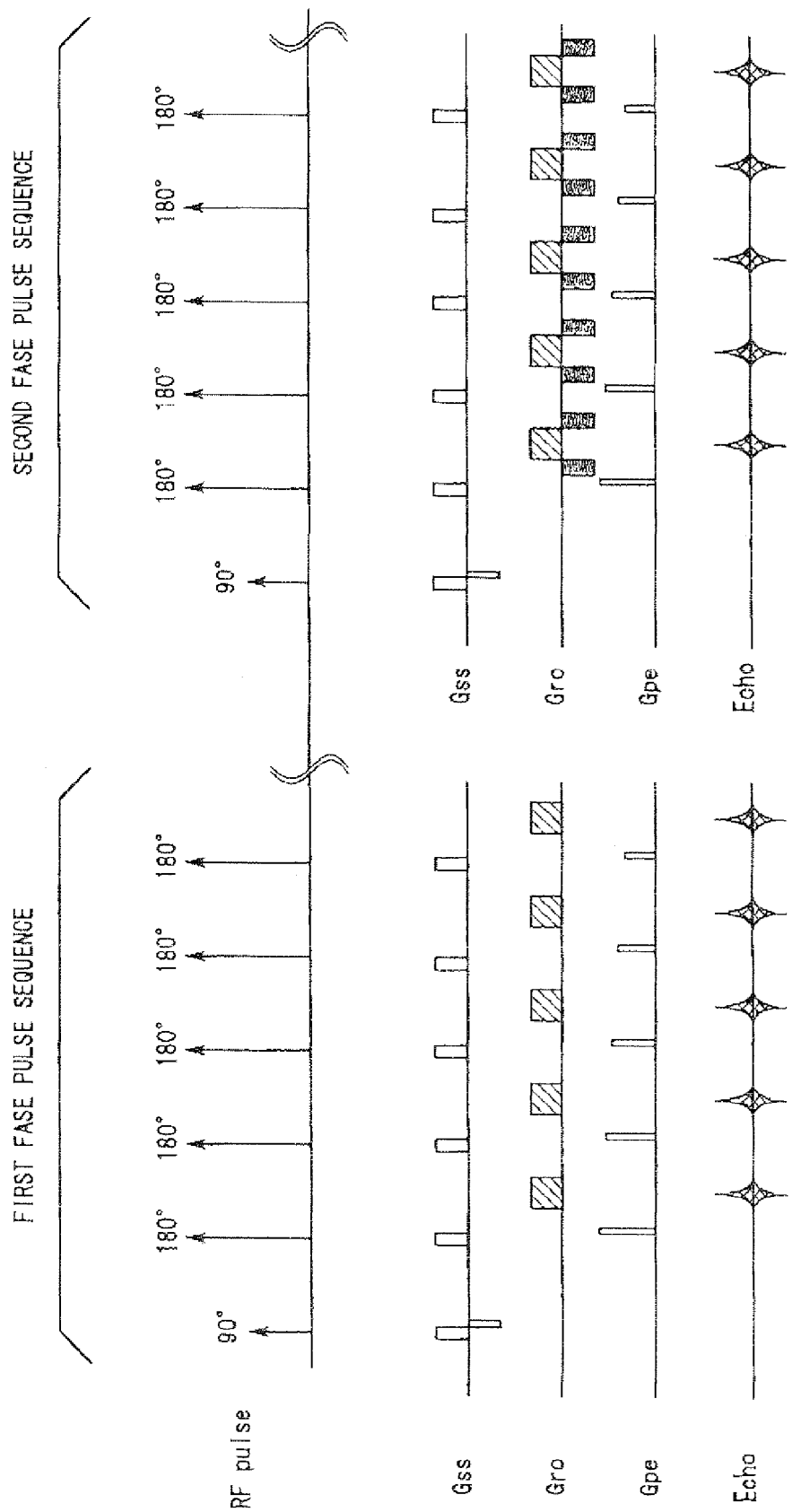
FIG. 14 is a diagram showing an example of a pulse sequence in which rephasing RO pulses and pulse main bodies are alternately applied.

On the other hand, FIG. 14 shows a pulse sequence in which the dephasing RO pulses in FIG. 3 are replaced with the pulse main bodies (the pulse main body is the dephasing RO pulse with the flow dephasing pulses on the opposite sides removed). The rephasing RO pulses are not changed. In this case, the first MR signals read out with the rephasing RO pulses are arranged at even-numbered positions (or odd-numbered positions) in the phase encoding direction in the k-space, and the second MR signals read out with the pulse main bodies are arranged at odd-numbered positions (or even-numbered positions) in the phase encoding direction in the k-space. If the dephasing RO pulses are replaced with the pulse main bodies, the difference in intensity between the first MR signal and the second MR signal is slightly smaller than that in the case where both the dephasing RO pulses and the rephasing RO pulses are used. However, depending on the part to be imaged or the cardiac phase, the difference in intensity between the first MR signal and the second MR signal can be increased, and the blood vessel wall image and the blood image can be separated from each other.

In the above description, it is assumed that the dephasing RO pulses and the rephasing RO pulses are periodically applied in a plane of a slice, such as alternately at even-numbered positions and odd-numbered positions. However, this approach may be expanded to a three-dimensional scan that uses both the phase encoding and the slice encoding as shown in FIGS. 15A and 15B.

Figure 15B:
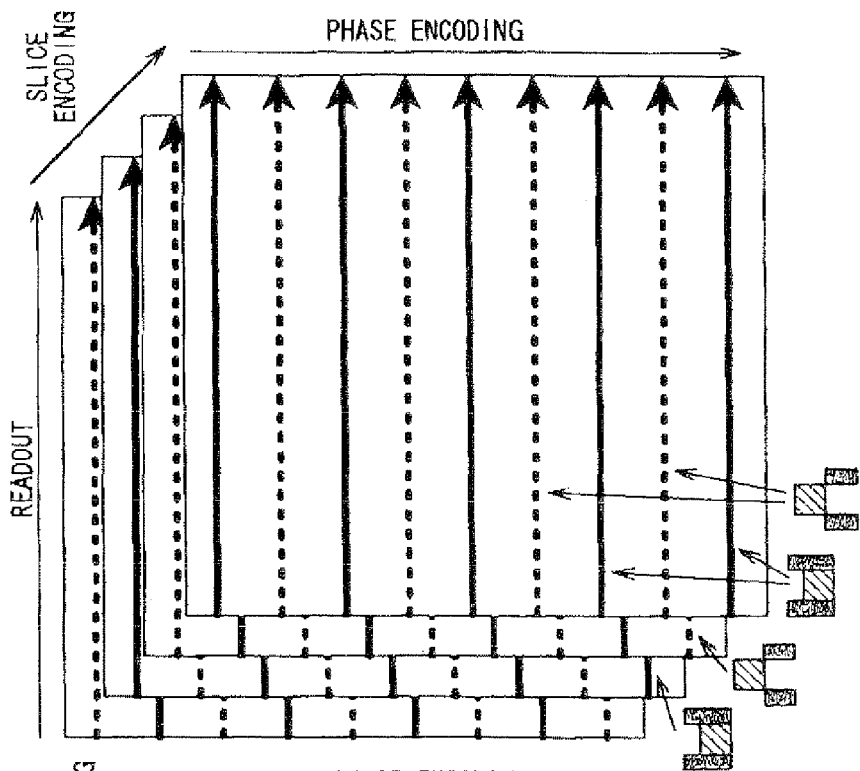
FIG. 15 is a diagram for illustrating a concept of a 3D imaging in which rephasing RO pulses and pulse main bodies are applied in a slice encoding direction and a phase encoding direction.
Figure 15A:
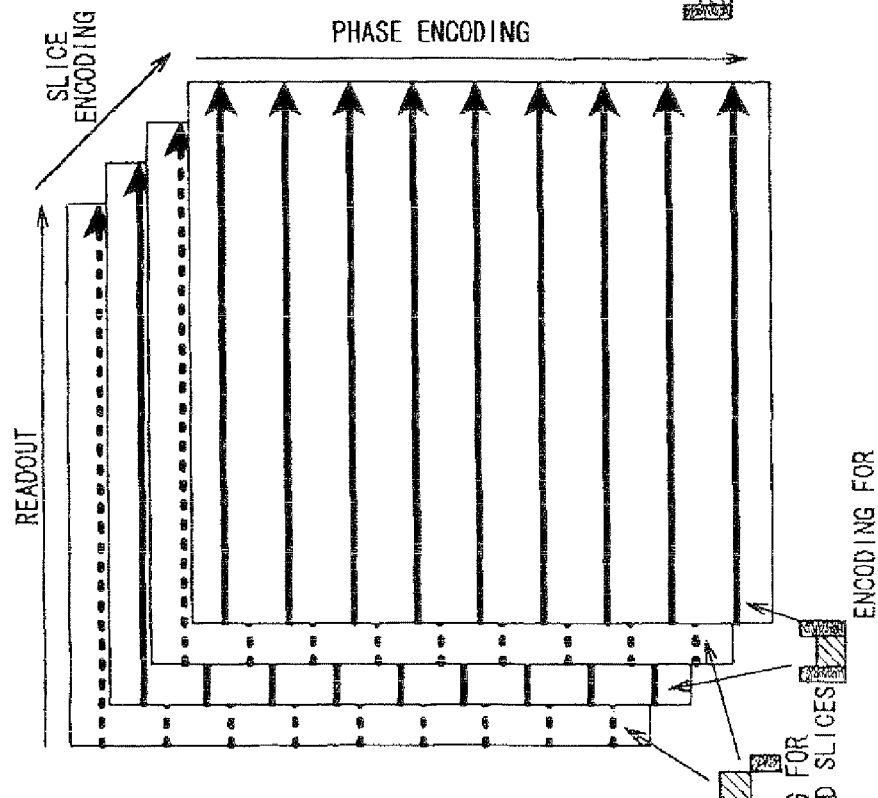

FIG. 15A shows an example in which the dephasing OR pulses and the rephasing RO pulses are periodically applied in the slice encoding direction. For example, the dephasing RO pulses are used for readout for an even-numbered slice, and the rephasing RO pulses are used for readout for an odd-numbered slice. According to this approach, the blood image can be shifted in the slice encoding direction. Furthermore, as in the second embodiment, the gathering FOV can be doubled in the slice encoding direction by halving the encoding interval in the slice encoding direction compared with the normal interval determined by the set FOV and doubling the encoding number in the slice encoding direction. With such a setting, the amount of shifting of the blood image in the slice encoding direction increases from N/2 to N, and thus, the image in the set FOV including the blood vessel wall image and the shifted blood image can be completely separated from each other.

Furthermore, as shown in FIG. 15B, the dephasing RO pulses and the rephasing RO pulses can be periodically applied both in the phase encoding direction and the slice encoding direction. In addition, the gathering FOV can be doubled both in the phase encoding direction and the slice encoding direction by halving the encoding interval both in the phase encoding direction and the slice encoding direction compared with the normal interval determined by the set FOV and doubling the encoding number both in the phase encoding direction and the slice encoding direction. With such a setting, the image in the set FOV including the blood vessel wall image and the shifted blood image can be completely separated from each other both in the phase encoding direction and the slice encoding direction. However, to reduce the imaging time, the FOV can also be doubled only one of the encoding directions.

Thus far, rephasing RO pulses or dephasing RO pulses are explained in which flow dephasing pulses and flow rephasing pulses are respectively added on both sides of each main body of the readout gradient Gro. Alternately or in combination, the flow dephasing pulses and the flow rephasing pulses may be respectively added on both sides of each main body of the slice selecting gradient Gss.

As described above, the magnetic resonance imaging apparatus 20 according to the embodiments described above or the like can produce, by one imaging, an image in which a blood image and a blood vessel wall image are separated from each other. Therefore, the user can grasp the condition of the blood vessel wall and the blood flowing in the blood vessel at the same time.

Note that, in the above description, an example in which a blood image and a blood vessel wall image are separated. However, more generally, the magnetic resonance imaging apparatus 20 according to the embodiments can obtain, by one imaging, an image in which a fluid image and a static part image surrounding the fluid are separated from each other. For example, an image in which a lymph fluid image and a lymph vessel wall image are separated from each other can be obtained. Also, an image in which a CSF (Cerebrospinal Fluid) image and a static part image surrounding the CSF are separated from each other can be obtained by one imaging.

While certain embodiments have been described, these embodiments have been presented by way of example only, and are not intended to limit the scope of the invention. Indeed, the novel apparatuses and units described herein may be embodied in a variety of other forms; furthermore, various omissions, substitutions and changes in the form of the apparatuses and units described herein may be made without departing from the spirit of the invention. The accompanying claims and their equivalents are intended to cover such forms or modifications as would fall within the scope and spirit of the invention.

What is claimed is:

1. A magnetic resonance imaging apparatus, comprising:
   a data gathering unit configured to gather magnetic resonance data in a non-contrast manner by applying a first readout gradient pulse having a zero-order moment of 0 and a second readout gradient pulse having a zero-order moment of 0 and a first-order moment of a value different from a value of a first-order moment of the first readout gradient pulse to a region of interest including a fluid in motion, wherein the first readout gradient pulse is a gradient pulse formed by adding to a pulse main body a flow dephasing pulse having a same polarity as the pulse main body, and the second readout gradient pulse is a gradient pulse formed by adding to the pulse main body a flow rephasing pulse having an opposite polarity to the pulse main body; and
   an image generating unit configured to periodically arrange first magnetic resonance data read out with the first readout gradient pulse and second magnetic resonance data read out with the second readout gradient pulse in at least one of a phase encoding direction and a slice encoding direction in a k-space to generate k-space data and reconstruct the k-space data, and to generate an image in which a fluid image and a static part image surrounding fluid are spatially separated from each other.

2. The magnetic resonance imaging apparatus according to claim 1, wherein the fluid is a blood flow, the fluid image is a blood image, and the static part image is a static part image including a blood vessel wall.

3. The magnetic resonance imaging apparatus according to claim 1, wherein the image generating unit arranges the first magnetic resonance data in an even-numbered row in the phase encoding direction in the k-space and the second magnetic resonance data in an odd-numbered row in the phase encoding direction in the k-space, or arranges the first magnetic resonance data in an odd-numbered row in the phase encoding direction in the k-space and the second magnetic resonance data in an even-numbered row in the phase encoding direction in the k-space.

4. The magnetic resonance imaging apparatus according to claim 2, wherein the image generating unit arranges the first magnetic resonance data in an even-numbered row in the phase encoding direction in the k-space and the second magnetic resonance data in an odd-numbered row in the phase encoding direction in the k-space, or arranges the first magnetic resonance data in an odd-numbered row in the phase encoding direction in the k-space and the second magnetic resonance data in an even-numbered row in the phase encoding direction in the k-space.

5. The magnetic resonance imaging apparatus according to claim 2, wherein the data gathering unit gathers the magnetic resonance data in a non-contrast manner in synchronization with pulsation of an object.

6. The magnetic resonance imaging apparatus according to claim 5, wherein the data gathering unit gathers the magnetic resonance data in a non-contrast manner during a systolic phase of a cardiac muscle.

7. A magnetic resonance imaging apparatus, comprising:
   a data gathering unit configured to gather magnetic resonance data in a non-contrast manner by applying a first readout gradient pulse having a zero-order moment of 0 and a second readout gradient pulse having a zero-order moment of 0 and a first-order moment of a value different from a value of a first-order moment of the first readout gradient pulse to a region of interest including a fluid in motion wherein the first readout gradient pulse is a gradient pulse formed by adding to a pulse main body a flow dephasing pulse having a same polarity as the pulse main body, and the second readout gradient pulse is a gradient pulse formed only by the pulse main body; and
   an image generating unit configured to periodically arrange first magnetic resonance data read out with the first readout gradient pulse and second magnetic resonance data read out with the second readout gradient pulse in at least one of a phase encoding direction and a slice encoding direction in a k-space to generate k-space data and reconstruct the k-space data, and to generate an image in which a fluid image and a static part image surrounding fluid are spatially separated from each other.

8. A magnetic resonance imaging apparatus, comprising:
a data gathering unit configured to gather magnetic resonance data in a non-contrast manner by applying a first readout gradient pulse having a zero-order moment of 0 and a second readout gradient pulse having a zero-order moment of 0 and a first-order moment of a value different from a value of a first-order moment of the first readout gradient pulse to a region of interest including a fluid in motion, wherein the first readout gradient pulse is a gradient pulse formed by adding to a pulse main body a flow rephasing pulse having an opposite polarity to the pulse main body, and the second readout gradient pulse is a gradient pulse formed only by the pulse main body; and
an image generating unit configured to periodically arrange first magnetic resonance data read out with the first readout gradient pulse and second magnetic resonance data read out with the second readout gradient pulse in at least one of a phase encoding direction and a slice encoding direction in a k-space to generate k-space data and reconstruct the k-space data, and to generate an image in which a fluid image and a static part image surrounding fluid are spatially separated from each other.

9. A magnetic resonance imaging apparatus, comprising:
a data gathering unit configured to gather magnetic resonance data in a non-contrast manner by applying a first readout gradient pulse having a zero-order moment of 0 and a second readout gradient pulse having a zero-order moment of 0 and a first-order moment of a value different from a value of a first-order moment of the first readout gradient pulse to a region of interest including a fluid in motion; and
an image generating unit configured to periodically arrange first magnetic resonance data read out with the first readout gradient pulse and second magnetic resonance data read out with the second readout gradient pulse in at least one of a phase encoding direction and a slice encoding direction in a k-space to generate k-space encoding direction and a slice encoding direction in a k-space to generate k-space data and reconstruct the k-space data, and to generate an image in which a fluid image and a static part image surrounding fluid are spatially separated from each other,
wherein the image generating unit performs oversampling in at least one of the phase encoding direction and the slice encoding direction in the k-space to make an encoding interval equal to 1/M, where M represents a real number larger than 1, and reconstructs the image having a FOV expanded by a factor of M in the encoding direction compared with a FOV in a case where the oversampling is not performed.

10. A magnetic resonance imaging apparatus, comprising:
a data gathering unit configured to gather magnetic resonance data in a non-contrast manner by applying a first readout gradient pulse having a zero-order moment of 0 and a second readout gradient pulse having a zero-order moment of 0 and a first-order moment of a value different from a value of a first-order moment of the first readout gradient pulse to a region of interest including a fluid in motion; and an image generating unit configured to periodically arrange first magnetic resonance data read out with the first readout gradient pulse and second magnetic resonance data read out with the second readout gradient pulse in at least one of a phase encoding direction and a slice encoding direction in a k-space to generate k-space data and reconstruct the k-space data, and to generate an image in which a fluid image and a static part image surrounding fluid are spatially separated from each other,
wherein the image generating unit performs oversampling to halve a phase encoding interval and double a phase encoding number in the k-space and reconstructs the image having a FOV doubled in the phase encoding direction compared with a FOV in a case where the oversampling is not performed.

11. The magnetic resonance imaging apparatus according to claim 10, wherein the fluid is a blood flow, the fluid image is a blood image, and the static part image is a static part image including a blood vessel wall.

12. The magnetic resonance imaging apparatus according to claim 11, wherein the image generating unit arranges the first magnetic resonance data in an even-numbered row in the phase encoding direction in the k-space and the second magnetic resonance data in an odd-numbered row in the phase encoding direction in the k-space, or arranges the first magnetic resonance data in an odd-numbered row in the phase encoding direction in the k-space and the second magnetic resonance data in an even-numbered row in the phase encoding direction in the k-space.

13. The magnetic resonance imaging apparatus according to claim 10, wherein the image generating unit an arranges the first magnetic resonance data in an even-numbered row in the phase encoding direction in the k-space and the second magnetic resonance data in an odd-numbered row in the phase encoding direction in the k-space, or arranges the first magnetic resonance data in an odd-numbered row in the phase encoding direction in the k-space and the second magnetic resonance data in an even-numbered row in the phase encoding direction in the k-space.

14. The magnetic resonance imaging apparatus according to claim 11, wherein the image generating unit generates a first image by extracting a region in which only blood is visualized from the image having a FOV doubled in the phase encoding direction and generates a second image by extracting a region in which a static part including a blood vessel wall from the image.

15. The magnetic resonance imaging apparatus according to claim 13, wherein the image generating unit generates a first image by extracting a region in which only blood is visualized from the image having a FOV doubled in the phase encoding direction and generates a second image by extracting a region in which a static part including a blood vessel wall from the image.

16. A magnetic resonance imaging apparatus, comprising:
a data gathering unit configured to gather magnetic resonance data in a non-contrast manner by applying a first readout gradient pulse having a zero-order moment of 0 and a second readout gradient pulse having a zero-order moment of 0 and a first-order moment of a value different from a value of a first-order moment of the first readout gradient pulse to a region of interest including a fluid in motion; and
an image generating unit configured to generate, by a common imaging, an image in which a blood image and a blood vessel wall image are spatially separated from each other, by periodically arranging first magnetic resonance data read out with the first readout gradient pulse and second magnetic resonance data read out with the second readout gradient pulse in at least one of a phase encoding direction and a slice encoding direction in a k-space to generate k-space data, and by reconstructing the k-space data.

* * * * *